US008436632B2

(12) United States Patent
Baek

(10) Patent No.: US 8,436,632 B2
(45) Date of Patent: May 7, 2013

(54) SYSTEM AND METHOD FOR OPTIMIZING LCD DISPLAYS

(75) Inventor: Hanwook Baek, Cumming, GA (US)

(73) Assignee: American Panel Corporation, Alpharetta, GA (US)

( * ) Notice: Subject to any disclaimer, the term of this patent is extended or adjusted under 35 U.S.C. 154(b) by 1319 days.

(21) Appl. No.: 12/164,000

(22) Filed: Jun. 27, 2008

(65) Prior Publication Data

US 2009/0322664 A1 Dec. 31, 2009

(51) Int. Cl.
*G01R 31/26* (2006.01)

(52) U.S. Cl.
USPC ........... 324/760.01; 324/96; 345/94; 362/558

(58) Field of Classification Search ............. 324/760.01, 324/762.01, 96; 345/690, 98; 702/108; 349/64, 349/112; 362/558
See application file for complete search history.

(56) References Cited

U.S. PATENT DOCUMENTS

| | | | | |
|---|---|---|---|---|
| 4,677,473 | A * | 6/1987 | Okamoto et al. | 348/126 |
| 4,870,357 | A | 9/1989 | Young et al. | |
| 5,051,872 | A * | 9/1991 | Anderson | 362/558 |
| 5,245,326 | A | 9/1993 | Zalph | |
| 5,293,178 | A | 3/1994 | Kobayashi | |
| 5,298,993 | A | 3/1994 | Edgar et al. | |
| 5,351,201 | A | 9/1994 | Harshbarger, Jr. et al. | |
| 5,537,145 | A | 7/1996 | Miseli | |
| 5,572,444 | A | 11/1996 | Lentz et al. | |
| 5,638,167 | A | 6/1997 | Nakamura | |
| 5,650,844 | A | 7/1997 | Aoki et al. | |
| 5,686,959 | A | 11/1997 | Hayashi et al. | |
| 5,717,780 | A | 2/1998 | Mitsumune et al. | |
| 5,734,158 | A * | 3/1998 | Nagashima et al. | 250/225 |
| 5,740,352 | A | 4/1998 | Philipp et al. | |
| 5,764,209 | A | 6/1998 | Hawthorne et al. | |
| 5,771,068 | A | 6/1998 | Sali et al. | |
| 5,793,221 | A | 8/1998 | Aoki | |
| 5,801,545 | A | 9/1998 | Takekoshi et al. | |
| 5,933,018 | A | 8/1999 | Komatsu | |
| 5,969,756 | A | 10/1999 | Buckley et al. | |
| 6,014,035 | A | 1/2000 | Taniguchi | |
| 6,177,955 | B1 | 1/2001 | Downen et al. | |
| 6,290,382 | B1 * | 9/2001 | Bourn et al. | 362/554 |
| 6,559,826 | B1 | 5/2003 | Mendelson et al. | |
| 6,600,468 | B1 | 7/2003 | Kim et al. | |
| 6,611,249 | B1 | 8/2003 | Evanicky et al. | |
| 6,809,746 | B2 | 10/2004 | Whittington et al. | |
| 7,180,530 | B2 | 2/2007 | Whittington et al. | |
| 7,202,695 | B2 * | 4/2007 | Chung et al. | 324/760.01 |
| 7,424,216 | B2 * | 9/2008 | Liem | 396/155 |
| 7,553,037 | B2 * | 6/2009 | Sullivan | 362/26 |
| 8,320,658 | B2 * | 11/2012 | Tanizaki et al. | 382/141 |
| 2008/0170380 | A1 * | 7/2008 | Pastore | 362/16 |

FOREIGN PATENT DOCUMENTS

| | | |
|---|---|---|
| JP | 8286169 | 11/1996 |

* cited by examiner

*Primary Examiner* — Arleen M Vazquez
(74) *Attorney, Agent, or Firm* — Standley Law Group LLP

(57) ABSTRACT

A method and system for determining the Vcom for a liquid crystal display by using a light diffusing unit.

20 Claims, 5 Drawing Sheets

FIGURE 6A
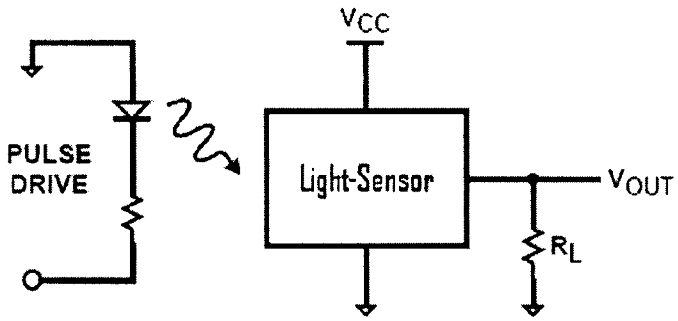
FIGURE 6B
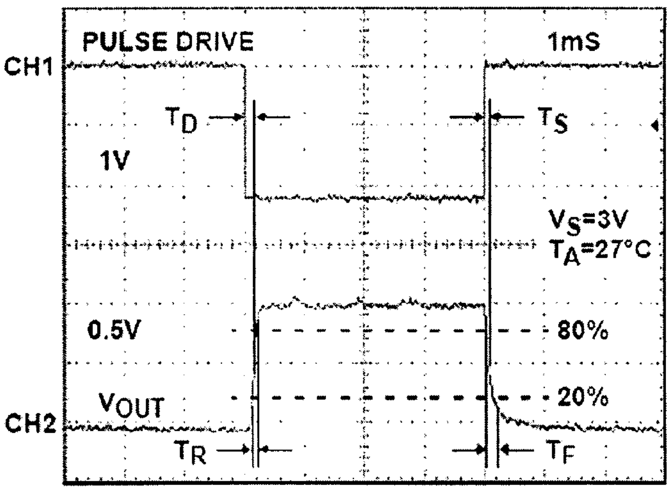
FIGURE 6C
| | | TYP | MAX | |
|---|---|---|---|---|
| $T_R$ | Rise Time (See Note) | 105 | 125 | μs |
| | | 64 | | μs |
| $T_F$ | Fall Time (See Note) | 170 | 225 | μs |
| | | 77 | | μs |
| $T_D$ | Delay Time for Rising Edge (See Note) | 165 | 200 | μs |
| | | 112 | | μs |
| $T_S$ | Delay Time for Falling Edge (See Note) | 65 | 85 | μs |
| | | 33 | | μs |

SYSTEM AND METHOD FOR OPTIMIZING LCD DISPLAYS

CROSS-REFERENCE TO RELATED APPLICATIONS

This application is a non-provisional patent application and makes no priority claim.

TECHNICAL FIELD

Exemplary embodiments relate generally to a method and system for determining the Vcom for a liquid crystal display by using a light diffusing unit.

BACKGROUND AND SUMMARY OF EXEMPLARY EMBODIMENTS

Embodiments relate generally to the automated testing, optimization and harmonization of the performance measurements of visual displays. More specifically, exemplary embodiments provide a system and method for efficiently determining the ideal Vcom for a liquid crystal display.

Embodiments may test, optimize and harmonize an active matrix liquid crystal display (AMLCD). AMLCD's are well known in the art, and depend on thin film transistors (TFT's) and capacitors to maintain an isolated charge at each subpixel until the next refresh cycle. They are arranged in a matrix on one of the glass panels between which is sandwiched the liquid crystal material. To address a particular subpixel, a gate voltage is applied to a row, switching on that row's transistors and thereby letting that row's subpixels accept a charge. Voltages ("gray level voltages") are applied to the columns corresponding to the light transmission level desired at individual subpixel elements at the intersection of the column and row in question. Since the other rows that the column intersects are turned off, only the capacitor at the designated subpixel receives a charge from a particular column.

The voltage potential differential between the front glass panel and a subpixel TFT controls the amount of "untwisting" accomplished by the twisted nematic liquid crystalline material at the subpixel element. This level of untwisting, in turn, determines the amount of light, which the material permits to pass through the front glass panel. By controlling the voltage applied to the subpixels, LCD's can create a gray scale. In one type of LCD monitor the liquid crystals organize into a structure that makes the subpixels transparent in the absence of a voltage differential.

A net voltage potential should not be maintained across the cell gap between the glass plates for an appreciable time or electroplating of the liquid crystalline material will occur, and image retention will result. A variety of driving schemes are known in the field to avoid the said electroplating phenomenon. One way to avoid electroplating is to minimize the voltage potential being maintained across the cell gap by supplying an alternating polarity voltage potential to each subpixel TFT relative to the common voltage of the opposite plate (Vcom).

With respect to the alternating voltage potentials applied to the subpixel TFT's, if the magnitude of the positive and negative potentials at the subpixels relative to Vcom are different the light transmission level will appear to flicker as the panel refreshes. This flickering occurs because the liquid crystal switches from one orientation to the opposite depending on the polarity of the potential, and the magnitude of light transmission is determined by the magnitude of that potential. If the magnitude of the positive potential differs from the magnitude of the negative potential, the light transmission changes as the waveform changes from positive to negative, and vice versa. This "unbalanced" state resulting in flicker increases the likelihood of electroplating since a nonzero voltage potential is effectively maintained across the cell gap. "Harmonizing" an LCD display implies balancing, or correcting, this unbalanced state.

By electrically balancing, or harmonizing, a panel to a high degree of accuracy, the present invention prevents image retention, as described above, and allows for the setting of the optimum, or maximum, voltage potential range, resulting in, among other characteristics, maximum contrast ratio and maximum luminance, or light transmission level. Additionally, flicker is minimized. Through automation, the present invention provides for a time-efficient and highly repeatable method of selecting the ideal Vcom for the display under test (DUT).

Currently, systems are available to automatically test visual displays by providing measurements on display characteristics (for example: luminance, transmission level, contrast ratio, luminance uniformity, chromaticity uniformity, viewing angle dependence, and luminous efficiency) of the visual displays. For example, U.S. Pat. No. 6,809,746 provides a system for the optimization of display characteristics and that patent is incorporated by reference in its entirety herein. While the teachings of the '746 patent may be used to determine Vcom, this method is time-consuming and requires the use of an expensive testing chamber as well as expensive equipment. Exemplary embodiments do not require a testing chamber, can be performed quickly and easily, and involve relatively inexpensive and widely available equipment.

Furthermore, existing testing methods measure the flicker at only small areas on the display. Thus, many measurements across the front of the display must be made in order to determine the best Vcom for the display. This process becomes extremely time consuming, especially for large displays. Exemplary embodiments utilize a diffuser unit so that the flicker within a region on the display surface may be analyzed, rather than a small group of pixels or subpixels. Further embodiments allow the overall flicker of the entire display to be measured at once.

The exemplary embodiments herein disclosed are not intended to be exhaustive or to unnecessarily limit the scope of the invention. The exemplary embodiments were chosen and described in order to explain the principles of the invention so that others skilled in the art may practice the invention. Having shown and described exemplary embodiments, those skilled in the art will realize that many variations and modifications may be made to affect the described invention. Many of those variations and modifications will provide the same result and fall within the spirit of the exemplary embodiments. It is the intention, therefore, to limit the embodiments only as indicated by the scope of the claims.

BRIEF DESCRIPTION OF THE DRAWINGS

A better understanding of the present invention will be obtained from a reading of the following detailed description and the accompanying drawings wherein identical reference characters refer to identical parts and in which:

FIG. 6A is a schematic showing how a light sensing device may be electrically driven by a pulse drive;

FIG. 6B is a graphical view showing a light sensing device's response to a driven pulse;

FIG. 6C is a chart showing the preferable values for a light sensing device to be used in exemplary embodiments.

DETAILED DESCRIPTION OF A PREFERRED EMBODIMENT

Figure 2:
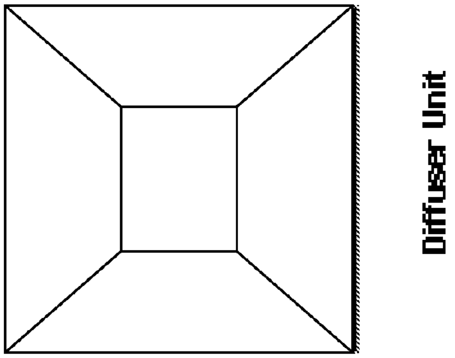
FIG. 2 is a front view of an embodiment of the diffuser unit.
Figure 1:
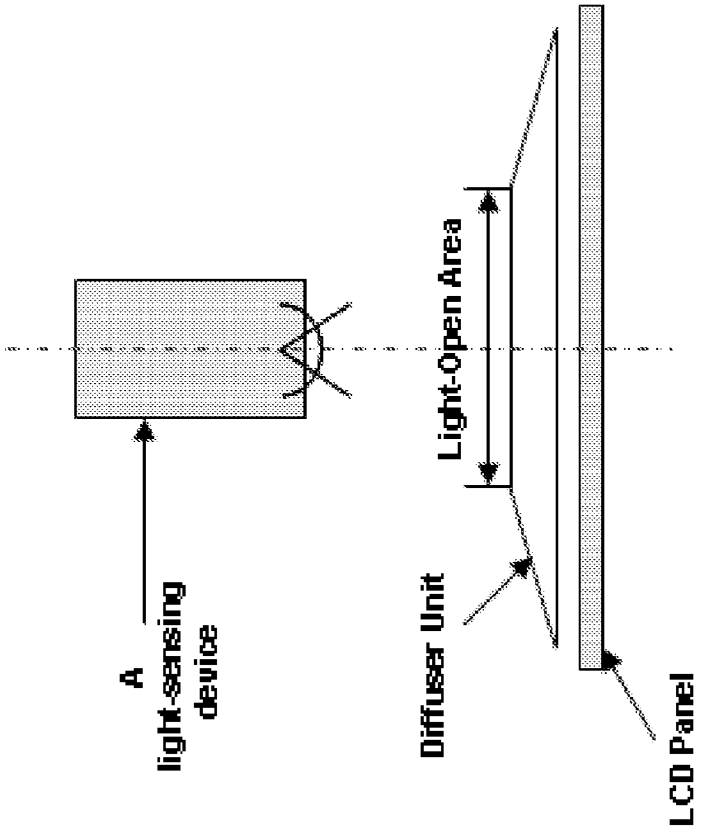
FIG. 1 is a top view of an embodiment of the system.
Figure 3:
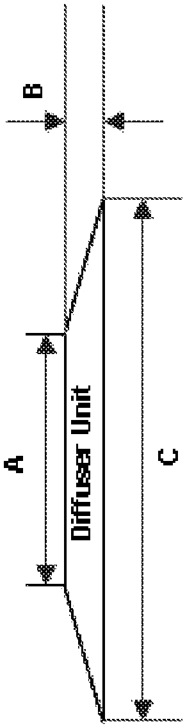
FIG. 3 is a top view of an embodiment of the diffuser unit.

FIG. 1 shows a top view of an embodiment for the layout of the system. A light diffuser unit is used to gather and normalize the various light sources exiting the surface of the LCD panel. FIG. 2 is a front view of an embodiment of the diffuser unit. The front and back sides of the diffuser unit are open to allow the passage of light. The side shape of the diffuser unit resembles a trapezoid and the sides should be shielded so that light cannot escape the diffuser device nor can ambient light enter the diffuser device. Once light from the LCD panel is gathered and normalized, it is permitted to exit the diffuser and travel towards the light-sensing device. This device may be a photometer. FIG. 3 shows that the dimensions A, B, and C can be altered to change the properties and/or performance of the diffuser unit. Embodiments can utilize the diffuser unit within an isolated chamber or may use the diffuser unit while immersed in ambient light. Exemplary embodiments can even utilize the diffuser unit once a display has been installed within its end-use environment. As such, exemplary embodiments can be easily portable and the method can be practiced anywhere.

Figure 4:
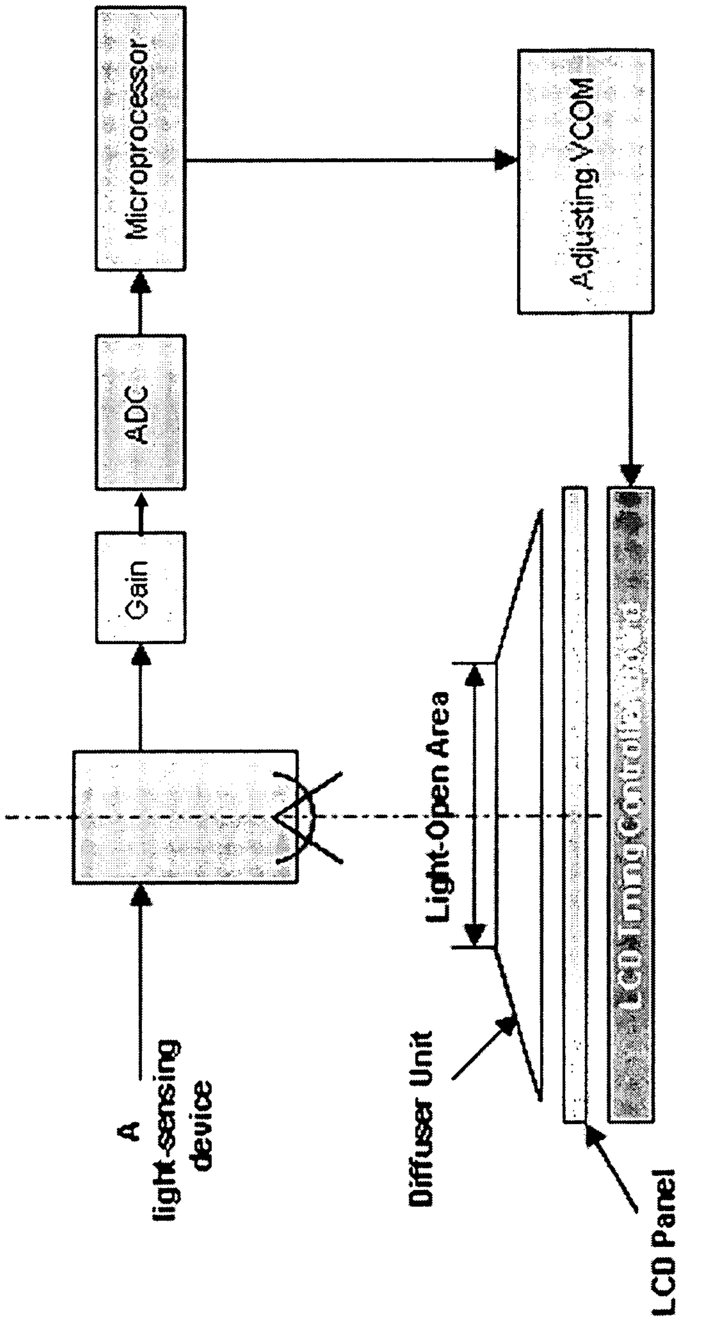
FIG. 4 is an electrical schematic for an embodiment of the system.

FIG. 4 shows the electrical schematic for one embodiment of the system. Gamma reference voltages (gray scale voltages) are preloaded into the system and are used with the LCD controller board to drive each sub-pixel. As discussed further below, any combination of Gamma voltages can be used with exemplary embodiments. Vcom may be calculated for only one Gamma voltage, or a plurality of Gamma voltages may be used to calculate a plurality of Vcoms. Although embodiments may be described as utilizing only one Gamma voltage, it should be recognized that one Gamma voltage is actually two voltage values, i.e. the voltage value above Vcom and the voltage value below Vcom. However, to minimize flicker, the absolute value of the two voltages should be the same, this is why it is referred to as a single Gamma voltage.

The signal from the light sensing device may be run through a gain device and then possibly through an analog-digital-conversion (ADC) device. The signal then may be processed by a microprocessor, which, after analyzing the signal and calculating the flicker, may adjust Vcom to minimize the flicker. The adjusted Vcom setting may then be sent to the LCD controller board and applied to the LCD panel. The process is again repeated as the new light which is generated based on the new Vcom enters the diffuser and is then measured by the light sensing device. Once the ideal Vcom is determined (that which corresponds to the lowest flicker), the process may end.

Figure 5:
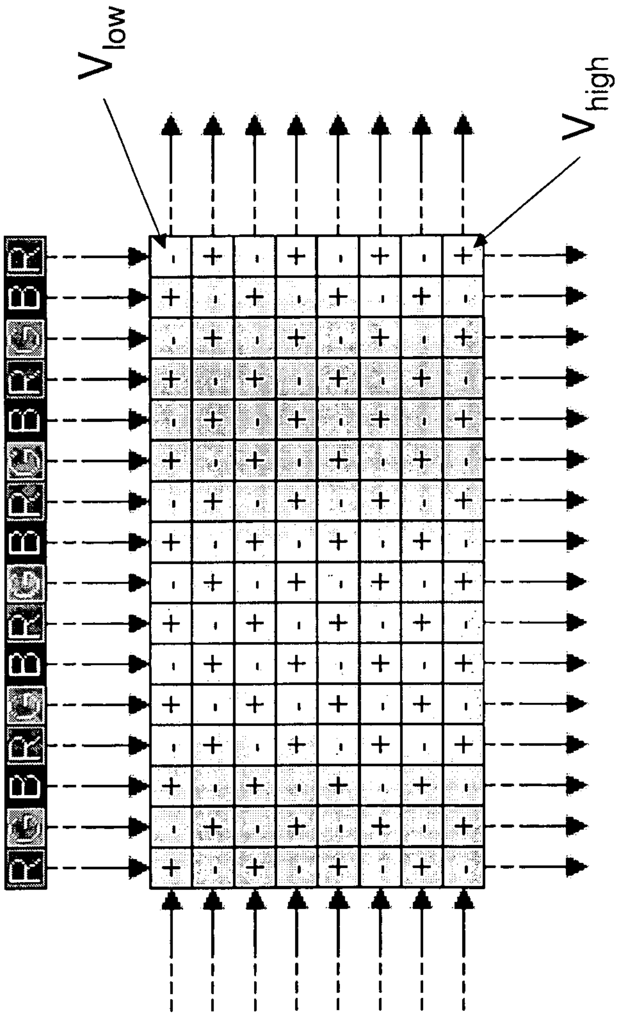
FIG. 5 is an illustration of the relative polarities of subpixel elements of a liquid crystal display panel, in accordance with one embodiment.

The ideal Vcom may be determined by measuring the flicker at a variety of Vcom voltages. One possible pixel-inversion pattern for the Gamma voltages is shown in FIG. 5. Flicker may be measured and Vcom may be calculated at only one set of Gamma voltages. Alternatively, a range of Gamma voltages may be used to measure Vcom at several points along the range of Gamma voltages. The resulting Vcoms may then be averaged to determine the most ideal Vcom for the display.

Measuring flicker can be done in many ways, one such way is to utilize the Display Tuning System manufactured by Westar Corporation (U.S. Pat. No. 6,177,955 herein incorporated entirely within by reference). Essentially, one set of Gamma voltages are applied at a time (Vhigh and Vlow) and the Vcom voltage is incrementally altered until the minimum flicker is measured by the light sensing device. It is to be understood that curve fitting is contemplated by exemplary embodiments to reduce the number of steps necessary to determine when the flicker minimum has been reached. It is also to be understood that said curve fitting and the choice of said initial default voltage setting can be aided by historical data from flicker minimization routines performed on similar display panels as the DUT.

As discussed above, the Gamma voltages alternate around Vcom at a rate that is half the frequency of the frame rate. Thus, the half frequency of the frame rate is the target that should be minimized when adjusting Vcom. Exemplary embodiments allow flicker to be measured even when the half frequency of the frame rate is beyond the visible frequency range. This has become important as the response time of liquid crystal material has been rapidly increasing. As such, the frame rate of video signal is now above 60 Hz such that 70-120 Hz may be used as the frame rate frequency. However, as long as the light-sensing device has a much faster response time than the time that it takes for the crystals to reorient themselves, embodiments would work properly.

Light passing through an LCD panel consists of many different light sources including different flicker-frequency components with different energy. But, most of the light energy from a LCD panel should be focused on the light sources of frame rate and half the frame rate. Even if the frame rate of incoming video is 120 Hz, embodiments would work properly if the response time of the light sensing device is much smaller than the period of 240 Hz (based on sampling theory). Thus, considering the rising/falling time of the light sensing device's response, the response time of the light sensing device should be smaller than the period of the frame-rate frequency×4. For example, in an exemplary embodiment, if the frame rate is 120 Hz, the response time would preferably be smaller than $1/[120\times4]=2.08$ ms.

FIG. 6A is a schematic showing how a light sensing device may be electrically driven by a pulse drive. FIG. 6B is a graphical view showing a light sensing device's response to a driven pulse. FIG. 6C is a chart showing the preferable values for a light sensing device to be used in exemplary embodiments.

Figure 7B:
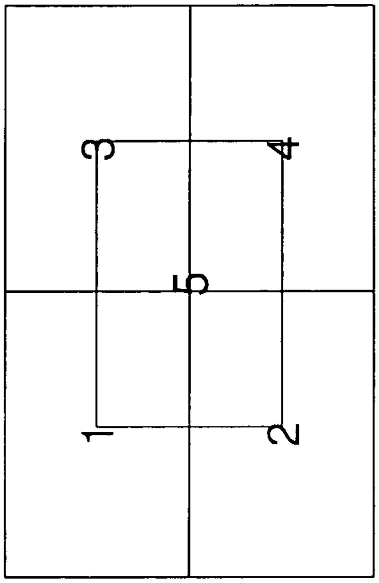
FIGS. 7A and 7B are side views showing possible orientations of the diffuser unit relative to the display.
Figure 7A:
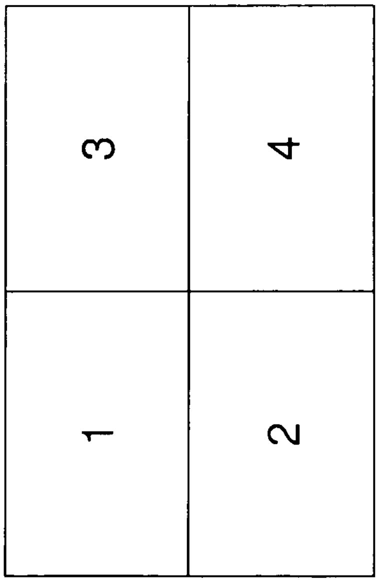

FIG. 7A is a side view showing the possible orientation of the diffuser unit relative to the display surface. The diffuser unit may be used to measure the flicker and determine the ideal Vcom for each of the four quadrants of the display. Each of the ideal Vcom's may then be averaged to determine the ideal Vcom for the overall display. Further, FIG. 7B shows another embodiment where Vcom is calculated at each of the four quadrants, and is then calculated at the center of the display. From here, all five Vcom calculations may be averaged to determine the ideal Vcom for the display. In another embodiment, the Vcom calculations may be weighted before being averaged, whereby the Vcom calculation for the center of the display is given more weight than the Vcom calculations which were from the four quadrants of the display. In other embodiments, the diffuser may cover the entire surface of the display and a single Vcom is calculated for the display.

The particular embodiment may be chosen to suit the particular display at issue, its intended application, and the manufacturing constraints upon it.

Having shown and described preferred embodiments, those skilled in the art will realize that many variations and modifications may be made to affect the described embodiments and still be within the scope of the claims. Thus, many of the elements indicated above may be altered or replaced by different elements which will provide the same result and fall within the spirit of the claimed embodiments. It is the intention, therefore, to limit the invention only as indicated by the scope of the claims.

What is claimed is:

1. A method for selecting Vcom for a liquid crystal display comprising the steps of:

A. covering at least a first portion of the display with a diffusing unit;

B. applying a first gamma voltage to the display;

C. normalizing the light exiting the first portion of the display with said diffusing unit;

D. measuring the flicker of the light exiting the diffusing unit; and

E. adjusting the Vcom of the display until the minimum flicker is measured and results in a first Vcom for the display.

2. The method of claim 1 further comprising the steps of:

repeating steps A-D with a second gamma voltage;

adjusting the Vcom of the display until the minimum flicker is measured and results in a second Vcom for the display; and averaging said first and second Vcom values to determine an average Vcom for the display.

3. The method of claim 1 further comprising the steps of:

covering a second portion of the display with said diffusing unit;

repeating steps B-D with the second portion;

adjusting the Vcom of the display until the minimum flicker is measured and results in a second Vcom for the display; and averaging the first and second Vcom values to determine an average Vcom for the display.

4. The method of claim 1 wherein said at least first portion is the entire viewable area of the display.

5. The method of claim 2 further comprising the steps of:

repeating steps A-D with a third and fourth gamma voltage;

adjusting the Vcom of the display until the minimum flicker is measured and results in a third and fourth Vcom for the display; and averaging said first, second, third, and fourth Vcom values to determine an average Vcom for the display.

6. The method of claim 3 further comprising the steps of:

covering a third portion of the display with said diffusing unit;

repeating steps B-D with the third portion;

adjusting the Vcom of the display until the minimum flicker is measured and results in a third Vcom for the display;

covering a fourth portion of the display with said diffusing unit;

repeating steps B-D with the fourth portion;

adjusting the Vcom of the display until the minimum flicker is measured and results in a fourth Vcom for the display; and averaging the first, second, third, and fourth Vcom values to determine an average Vcom for the display.

7. The method of claim 6 further comprising the step of preventing ambient light from entering the diffusing unit.

8. The method of selecting a Vcom for a liquid crystal display comprising the steps of:

A. covering a first quadrant of the display with a diffusing unit;

B. applying a first gamma voltage to the display;

C. normalizing the light exiting the first quadrant of the display with said diffusing unit;

D. measuring the flicker of the light exiting the diffusing unit;

E. adjusting the Vcom of the display until the minimum flicker is measured and results in a Vcom for the first quadrant F. covering a second, third, and fourth quadrant of the display with a diffusing unit;

G. repeating steps B-E resulting in a Vcom for the second, third, and fourth quadrant; and H. averaging the Vcoms for the first, second, third, and fourth quadrants resulting in a first average Vcom for the display.

9. The method of claim 8 further comprising the steps of:

I. covering the center portion of the display with a diffusing unit;

J. repeating steps B-E resulting in a Vcom for the center portion of the display; and K. averaging the Vcoms for the first, second, third, and fourth quadrants with the Vcom for the center portion of the display resulting in a first average Vcom for the display.

10. The method of claim 8 further comprising the steps of:

I. covering the center portion of the display with a diffusing unit;

J. repeating steps B-E resulting in a Vcom for the center portion of the display;

K. weighting the Vcom for the center portion of the display resulting in a weighted value for the center portion Vcom; and L. averaging the Vcoms for the first, second, third, and fourth quadrants with the weighted value for the center portion Vcom resulting in a first weighted-average Vcom for the display.

11. The method of claim 8 further comprising the steps of:

repeating steps A-H for a plurality of gamma voltages resulting in a plurality of average Vcoms for the display; and averaging the first average and the plurality of average Vcoms resulting in an ideal Vcom for the display.

12. The method of claim 9 further comprising the steps of:

repeating steps A-K for a plurality of gamma voltages resulting in a plurality of average Vcoms for the display; and averaging the first average and the plurality of average Vcoms resulting in an ideal Vcom for the display.

13. The method of claim 10 further comprising the steps of:

repeating steps A-L for a plurality of gamma voltages resulting in a plurality of weighted-average Vcoms for the display; and averaging the first weighted-average Vcom and the plurality of weighted-average Vcoms resulting in an ideal Vcom for the display.

14. The method of claim 9 further comprising the step of preventing ambient light from entering the diffuser.

15. A system for determining Vcom for a liquid crystal display having a display surface and a LCD control board, said system comprising:

a diffuser having a first opening with a first area and a second opening with a second area where said first opening is against the display surface and said first area is larger than the second area;

a light sensing device adjacent to the second opening of said diffuser; and a microprocessor receiving electrical signals from said light sensing device and in electrical communication with the LCD control board.

16. The system of claim 15 further comprising an analog-digital converter between the light sensing device and the microprocessor.

17. The system of claim 15 wherein said diffuser prevents ambient light from entering said first opening.

18. The system of claim 15 wherein the internal surfaces of said diffuser are highly reflective.

19. The system of claim 15 wherein the diffuser covers the entire display surface.

20. The system of claim 15 wherein the diffuser covers a quadrant of the display surface.

* * * * *